ical Patent [19]

United States Patent [19]

Grabbe et al.

[11] Patent Number: 4,679,319
[45] Date of Patent: Jul. 14, 1987

[54] TOOL AND METHOD FOR REMOVING CONNECTOR HOUSINGS FROM TERMINALS MOUNTED ON A SUBSTRATE

[75] Inventors: Dimitry G. Grabbe, Middletown; Iosif Korsunsky, Harrisburg, both of Pa.

[73] Assignee: AMP Incorporated, Harrisburg, Pa.

[21] Appl. No.: 885,121

[22] Filed: Jul. 14, 1986

[51] Int. Cl.⁴ ............................................. H05K 13/04
[52] U.S. Cl. ........................................ 29/843; 29/764; 29/825
[58] Field of Search ................. 29/764, 758, 268, 747, 29/843, 825

[56] References Cited

U.S. PATENT DOCUMENTS

| | | | |
|---|---|---|---|
| 3,317,989 | 5/1967 | Cull | 29/203 |
| 3,443,297 | 5/1969 | Lusby, Jr. | 29/203 |
| 3,538,580 | 11/1970 | Bruner | 29/203 |
| 3,896,533 | 7/1975 | Ullman et al. | 29/203 B |
| 3,990,863 | 11/1976 | Palmer | 29/203 B |
| 4,033,032 | 7/1977 | Romania et al. | 29/764 |
| 4,068,374 | 1/1978 | Coller | 29/747 |
| 4,117,590 | 10/1978 | Rapp | 29/764 |
| 4,215,468 | 8/1980 | Greco | 29/764 |
| 4,387,610 | 6/1983 | Sergeant | 81/5.1 R |
| 4,521,959 | 6/1985 | Sprenkle | 29/741 |
| 4,597,174 | 7/1986 | Sevigny | 29/741 |
| 4,604,796 | 8/1986 | Tsipenyuk et al. | 29/764 |

Primary Examiner—Carl E. Hall
Attorney, Agent, or Firm—Frederick W. Raring; Bruce J. Wolstoncroft

[57] ABSTRACT

A tool and method are described for removing a chip carrier socket housing from terminals which are received in the housing and which are mounted on a substrate. The tool comprises a yoke having pulling arms pivoted thereto which have free ends that engage the housing at the corners thereof. A central axial opening extends through the yoke and a slide is slidable in the opening. The slide has a reaction plate on its end which is shaped to engage the upper free ends of the terminals. A locking cam is provided which locks the pulling arms in their engaged positions with the housing. An actuating means causes the yoke and the pulling arms to move upwardly (relative to the substrate on which the terminals are mounted) with respect to the reaction plate. The housing is thus pulled by the arms upwardly and from the terminals.

18 Claims, 8 Drawing Figures

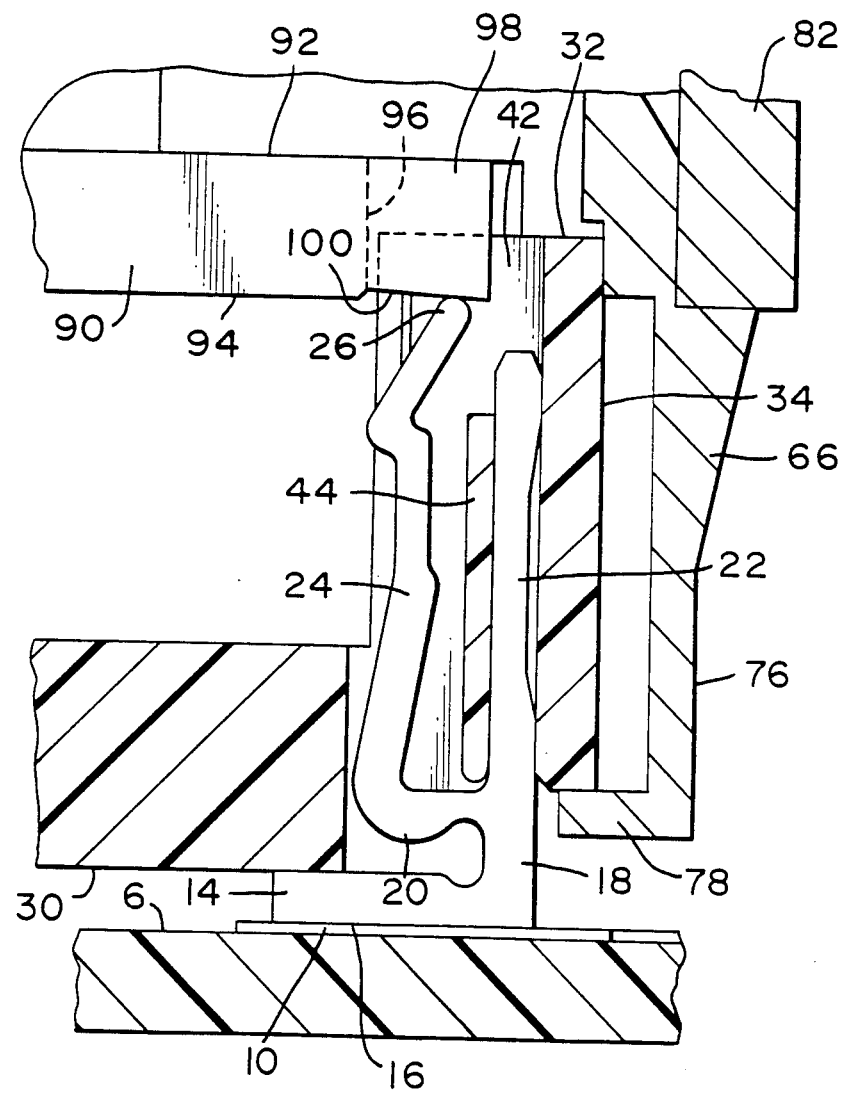

TOOL AND METHOD FOR REMOVING CONNECTOR HOUSINGS FROM TERMINALS MOUNTED ON A SUBSTRATE

FIELD OF THE INVENTION

This invention relates to tools and methods for removing an insulating housing from a group of terminals which are mounted on one surface of a substrate such as a circuit board.

BACKGROUND OF THE INVENTION

It is common practice in the electronics industry to mount an integrated circuit (IC) in a chip carrier in the form of a square body of plastic insulating material having outwardly facing side surfaces on which are provided contact areas. Conductors contained in the insulating body extend from the contact areas to the IC chip which is imbedded in the body.

In order to connect the contact areas on the IC chip carrier to conductors on a substrate such as a circuit board, a specialized type of connector referred to as a chip carrier socket is used. The chip carrier socket comprises an insulating housing, which is usually square, having a recess therein which is dimensioned to receive the IC chip carrier. Terminals are mounted in the housing in surrounding relationship to the recess and have contact portions which engage the contact areas of the chip carrier. The terminals extend beyond one face of the housing and are soldered to conductors on the substrate. The present trend in the electronics industry is to make these soldered connections by "surface mount" techniques in which the edges of the terminals are soldered directly to the adjacent surface of the substrate. Surface mounting techniques are to a large extent replacing the previous method of providing posts on the terminals which extend through the substrate and are soldered to conductors on the underside thereof.

The socket housing is usually designed such that the cavities therein which receive the terminals extend entirely through the housing from the lower face (the face adjacent to the substrate) to the upper face thereof. It is possible, therefore, to remove the housing from the terminals by merely pulling upwardly on the housing. However, removal of the housing in this manner can damage the soldered connections between the terminals and the substrate, particularly if the terminals are connected to the substrate by surface mounting techniques. The terminals usually have a relatively tight interference fit in the cavities in the housing and if the housing is pulled upwardly, the terminals will be stressed in tension and the soldered joints will therefore be stressed and may be broken.

The present invention is accordingly directed to the achievement of a tool and method which will permit removal of a chip carrier socket housing from its associated terminals without damage to the terminals so that the housing can be reassembled to the terminals at a later time.

THE INVENTION

The invention comprises a pulling tool of the type comprising a yoke having a central axis, and a plurality of pulling arms which are pivoted to the yoke at spaced angular intervals around the central axis. The arms extend from the yoke beside, and along, the central axis in a first axial direction and are arcuately movable towards and away from the central axis. A reaction member is provided and actuating means are also provided for moving the yoke relative to the reaction member in a second axial direction which is the opposite direction of the first axial direction. The tool is intended to remove a housing from a group of terminals which are mounted on a substrate, the terminals being arranged in at least two parallel rows and have terminal end portions which are spaced from the substrate. The housing has a lower face which is parallel to, and opposed to, the substrate and has an upper face which is spaced from the substrate. A recess extends inwardly from the upper face towards the lower face, the recess having recess sidewalls which surround the recess and which extend inwardly from the upper face and normally thereof. The housing has terminal receiving cavities which extend inwardly from the recess sidewalls and which extend from the lower face towards the upper face, the terminals being in the cavities. The tool is characterized in that the reaction member comprises a reaction plate having parallel major surfaces and circumferential side surfaces which extend normally of the major surfaces. The reaction plate is dimensioned to fit between the rows of terminals. The pulling arms have free ends which have housing engaging portions thereon for engagement with the housings. In use, the tool is positioned above the housing with the reaction plate between the rows of terminals. Thereafter, the pulling arms are moved arcuately towards the central axis until the housing engaging portions are engaged with the housing. The yoke is then moved relative to the reaction plate in the second axial direction so that the arms will pull the housing from the terminals while the reaction plate remains stationary against the free ends of the terminals.

In accordance with further embodiments, locking means are provided for locking the arms in engaged positions with the housing, the locking means comprising a locking cam which surrounds the arms and which is movable relative to the arms on the yoke in the first and second axial directions between a locking position and an unlocked position. The locking cam and the arms have camming surfaces the cam follower surfaces for locking the arms in the engaged position when the locking cam is in its locking position.

THE DRAWING FIGURES

FIG. 8 is a fragmentary view on a greatly enlarged scale showing the reaction plate in the manner in which it engages the free ends of the terminals and showing the manner in which the pulling arms engage the corners of the housing. This view is taken along the irregular section line 8—8 of FIG. 1 but shows portions of the tool engaged with the housing.

THE DISCLOSED EMBODIMENT

Figure 1:
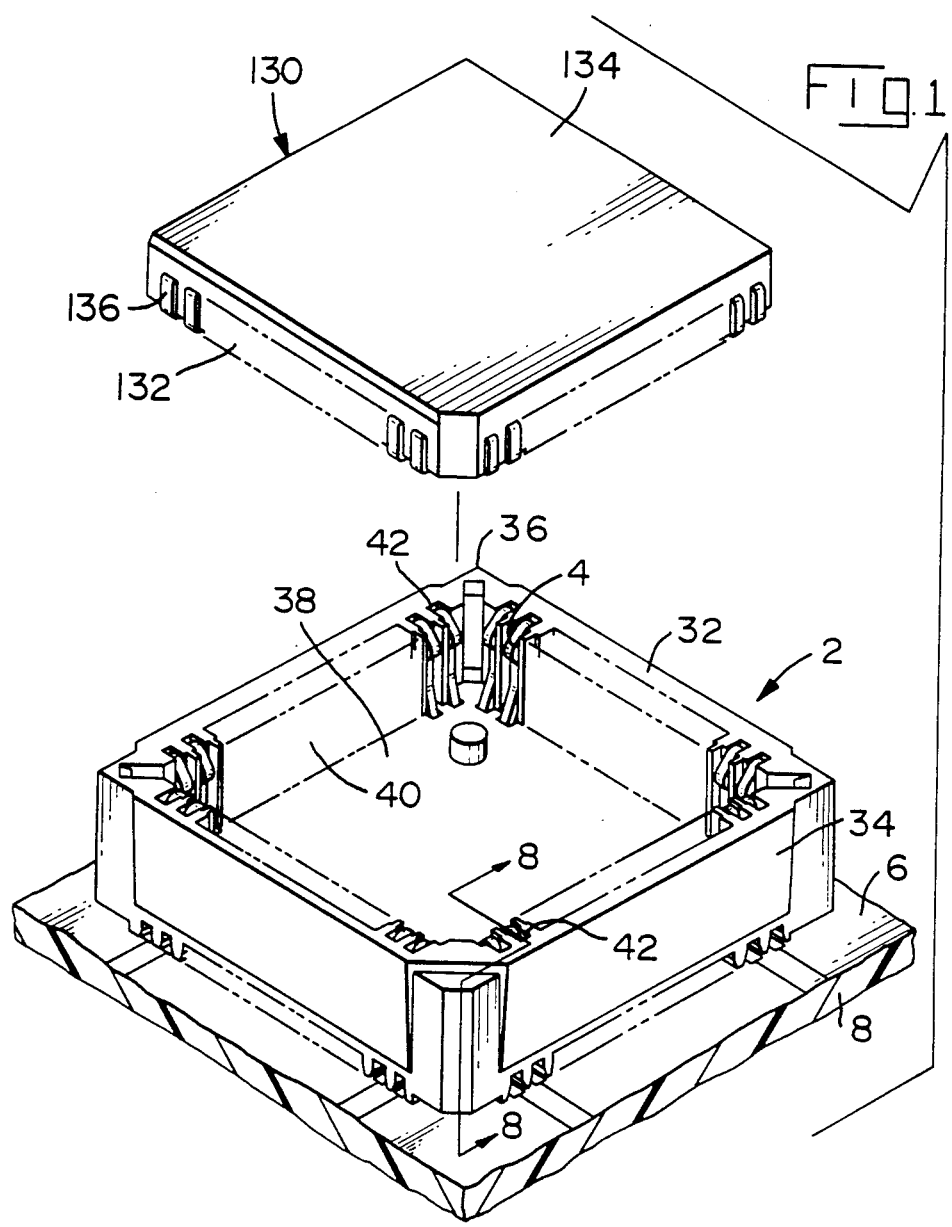
FIG. 1 is a perspective view of a typical chip carrier socket housing mounted on a substrate with a chip carrier exploded from the carrier receiving recess in the socket.
Figure 2:
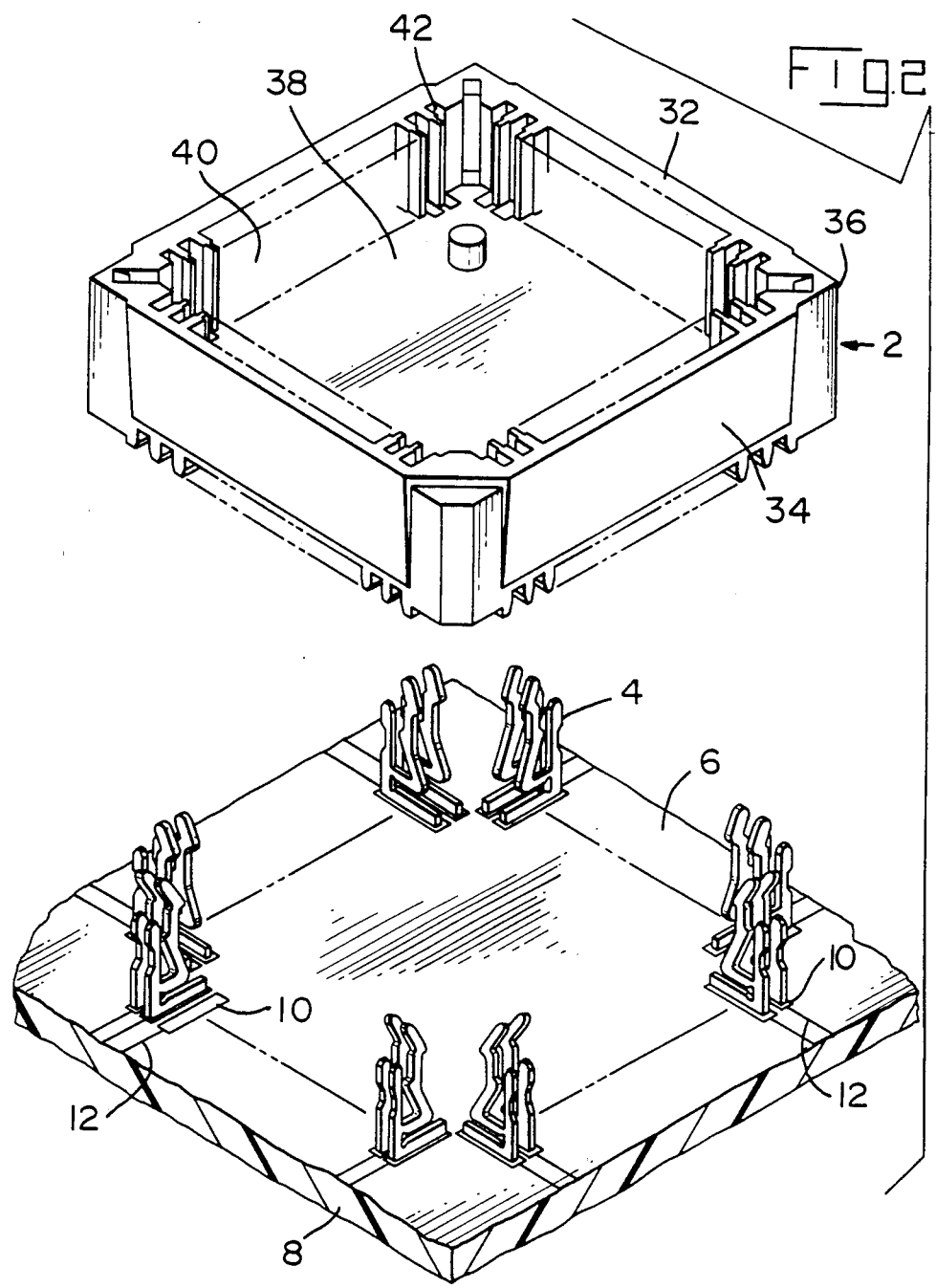
FIG. 2 is a perspective view showing the housing exploded from the terminals and showing the manner in which the terminals are mounted on the substrate.
Figure 3:
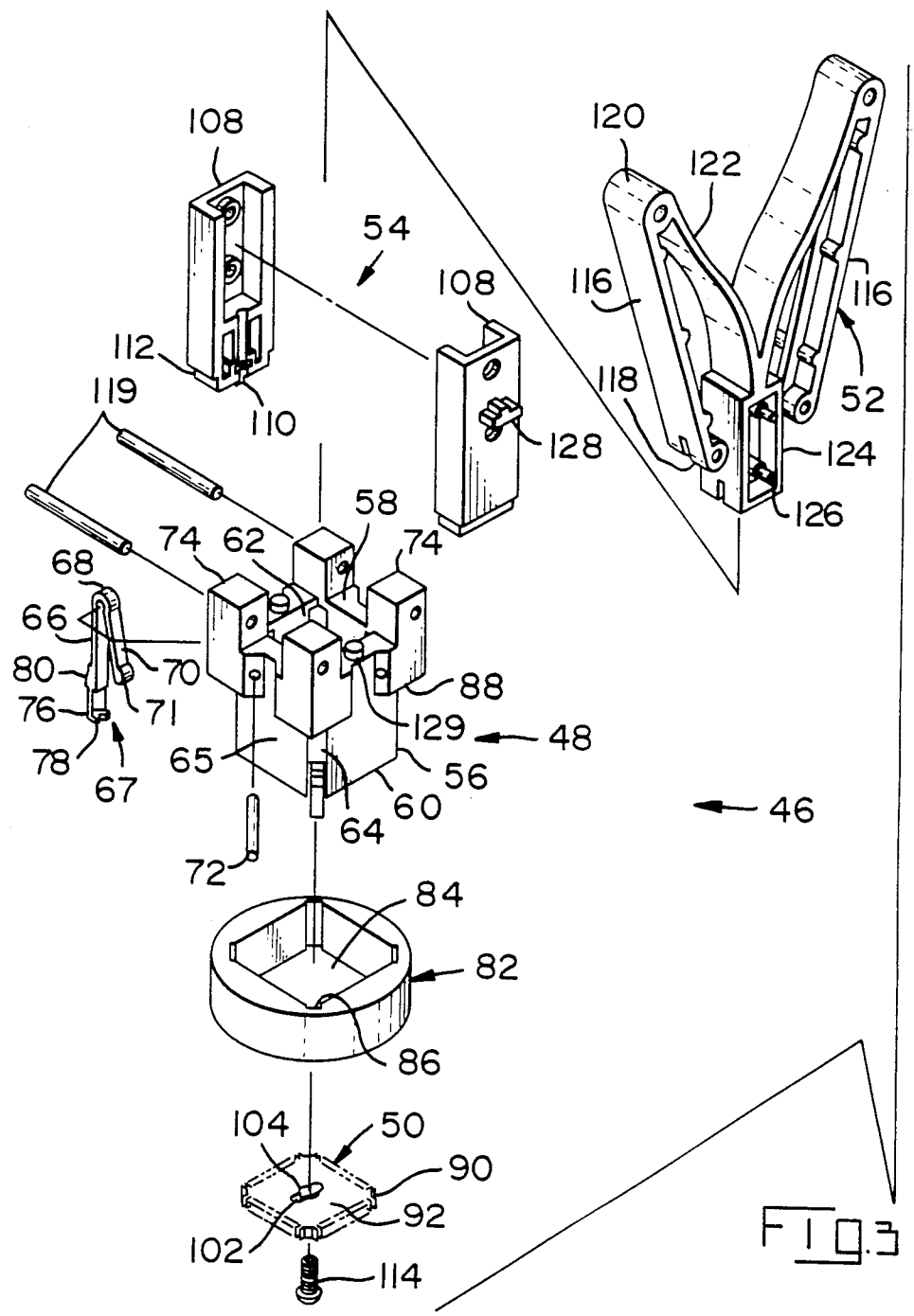
FIG. 3 is a perspective view of the parts of a tool in accordance with the invention exploded from each other.
Figure 4:
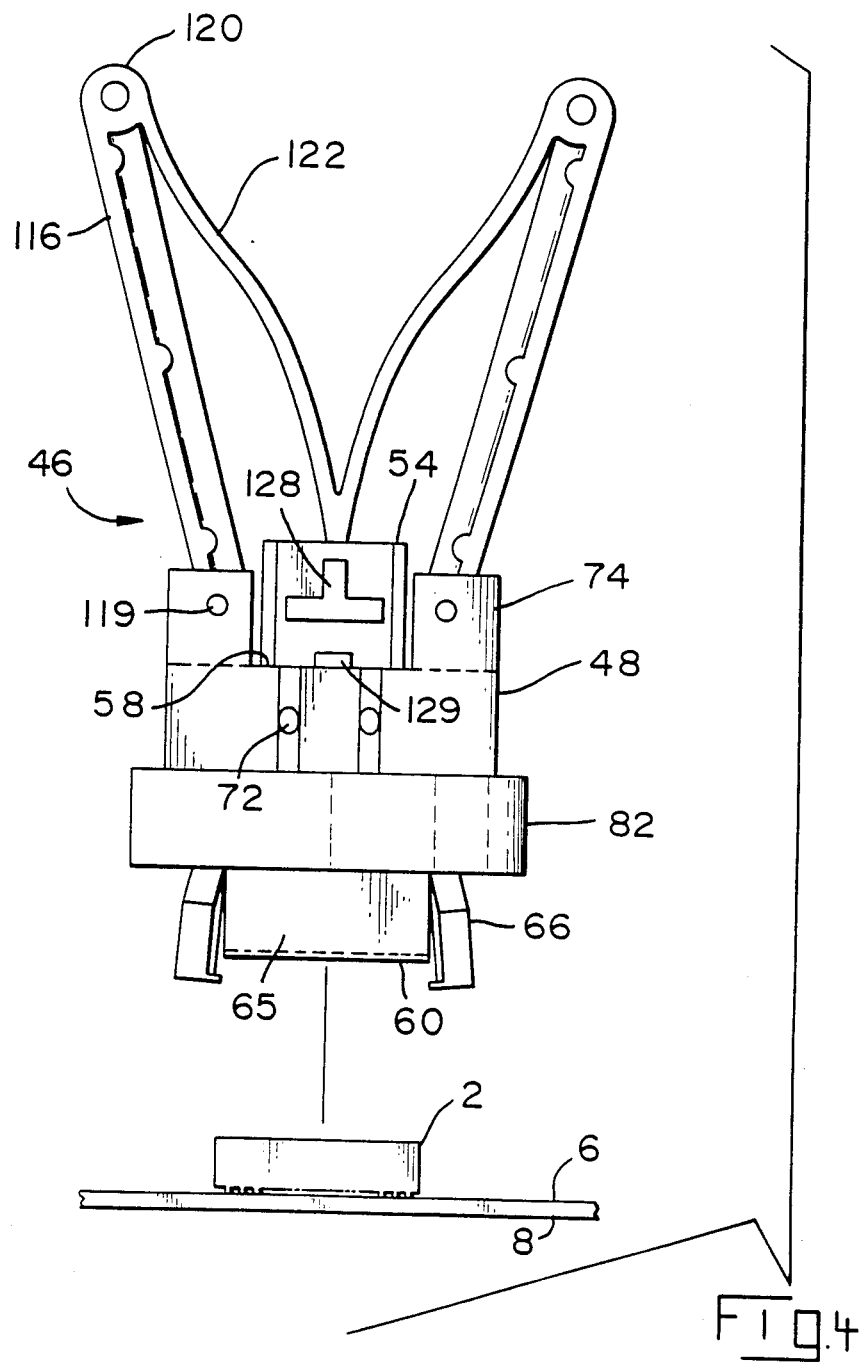
FIG. 4 is a side view of the assembled tool.

Referring first to FIGS. 1, 2 and 8, a typical integrated circuit chip carrier 130 comprises a flat square body of insulating material having oppositely-facing major surfaces 134 and outwardly directed side surfaces 132 on which there are provided spaced-apart contact zones 136. These contact zones are connected by conductors embedded in the insulating body to an integrated circuit chip which is also embedded in the insulating body.

In order to connect the contact areas 136 on the IC chip carrier to conductors on a substrate such as a circuit board, a chip carrier socket assembly is provided as shown in FIGS. 1 and 2. The socket assembly comprises a socket housing 2 containing terminals 4 which are soldered to terminal pads 10 on the upper surface 6 of the substrate 8. The conductors 12 on the surface 6 extend to these terminals pads and thereby serve to connect the integrated circuit to other parts of the apparatus. In the disclosed embodiment, the terminals are surface mounted which is to say they are soldered directly to the terminal areas on the upper surface of the substrate.

Each terminal 4 is a flat stamped member having a base 14, the lower edge 16 of which is soldered to the terminal area 10, a neck 18, a terminal yoke 20, and arms 22, 24 extending from the terminal yoke. Terminals of this type and housings as described below are described fully in U.S. application Ser. No. 814,511, filed Dec. 8, 1985 (Docket No. 13614) which is hereby incorporated by reference in its entirety.

The housing 2 is a square molding of insulating material having a lower face 30, an upper face 32 (with reference to the surface 6 of the substrate), and external sidewalls 34 which intersect at corners 36. A recess 38 extends inwardly from the upper surface and has recess sidewalls 40. Terminal receiving cavities 42 extend inwardly from these sidewalls and also extend from the lower face to the upper face as best shown in FIG. 8. The particular housing and terminal arrangement shown has a barrier wall 44 which is between the two arms as explained in the above-referenced pending application.

As explained in application Ser. No. 814,511, the housing 2 has the terminals contained therein when it is suppled to the user. The housing and terminals are mounted on the surface 6 of the substrate by placing the housing on the surface 6 with the edges 16 of the terminals 4 on the pads 10 and then heating the housing and terminals to cause the edges to become soldered. As shown in FIG. 2, the terminals are arranged in four rows which form a square. The four rows of terminals are two pairs of parallel spaced apart rows in the embodiment shown. In some instances, the housing may contain only one pair of spaced apart rows of terminals (i.e. two spaced-apart rows), for example where the chip carrier has contact areas 136 on only two opposite sides thereof.

It will be apparent from FIG. 8 that the upper free end 26 of the arm 24 is recessed from the face 32 of the housing. It will also be apparent from FIG. 8 that the housing might be removed from the terminals by merely moving the housing upwardly. However, the terminals are dimensioned such that they have a relatively tight interference fit in their respective cavities so that simply pulling upwardly on the housing would result in the imposition of severe tensile stresses on the soldered areas which connect the lower edge 16 of the base 14 of each terminal to the terminal areas 10 of the substrate. Such tensile stresses would very likely cause damage to the soldered joints.

Referring now to FIGS. 3-7, a tool 46 in accordance with the invention comprises a tool yoke 48, a reaction plate 50, and an actuating means comprising actuator handles 52 and a slide 54.

Figure 6:
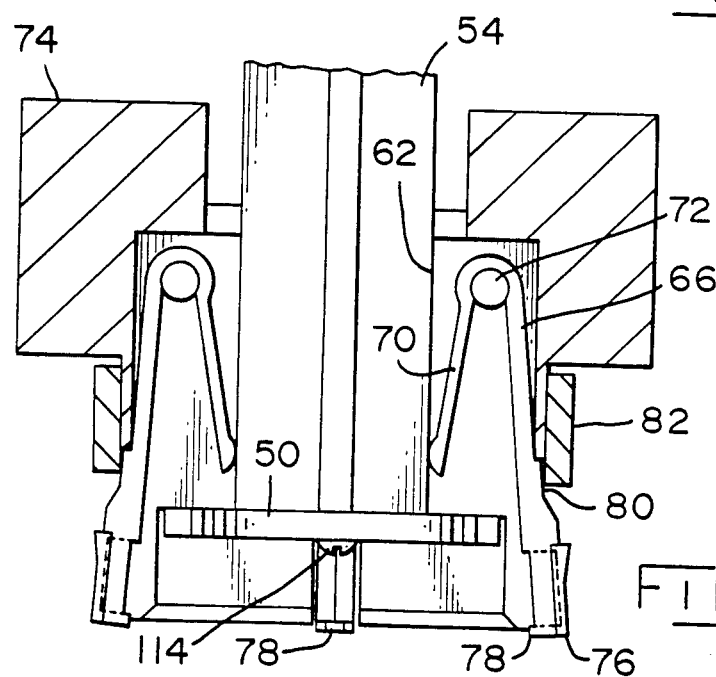
FIG. 6 is a view looking in the direction of the arrows 6—6 of FIG. 5.

The yoke 48 has a square cross section, an upper end 58, a lower end 60, as viewed in the drawing, and a central opening 62 extending between the ends which contains the central axis of the tool and to which reference will be made. Slots 64 are provided at the corners of the yoke and extend upwardly from the lower end 60 thereof and intersect the external sidewalls 65. A pulling member 67 is provided in each of these slots, each pulling member having a pulling arm 66 and a spring arm 70, the two arms being connected to each other by a connecting section 68 which also functions as a bearing for a pivot pin 72. The arm 70 has a lower end 71 which bears against the floor of the associated slot as shown in FIG. 6 and this arm functions as a spring so that the pulling arm is normally biased outwardly to the position shown in FIG. 6 although it can be flexed inwardly to the position shown in FIG. 7. The pivot pin 72 extends through the yoke at the corners thereof and partially through enlarged projections 74 at the corners on the upper side 58 of the yoke.

The free end 76 of each pulling arm 66 has an inwardly directed lip 78 which is contoured to engage the underside of the housing at a corner thereof, the lip and the internal surface of the arm effectively forming a pocket so that the housing can be pulled upwardly when the yoke is moved relatively upwardly as will be described below. The outer surface of each arm has a cam follower portion 80 which cooperates with camming surfaces 86 on a camming ring 82.

Figure 7:
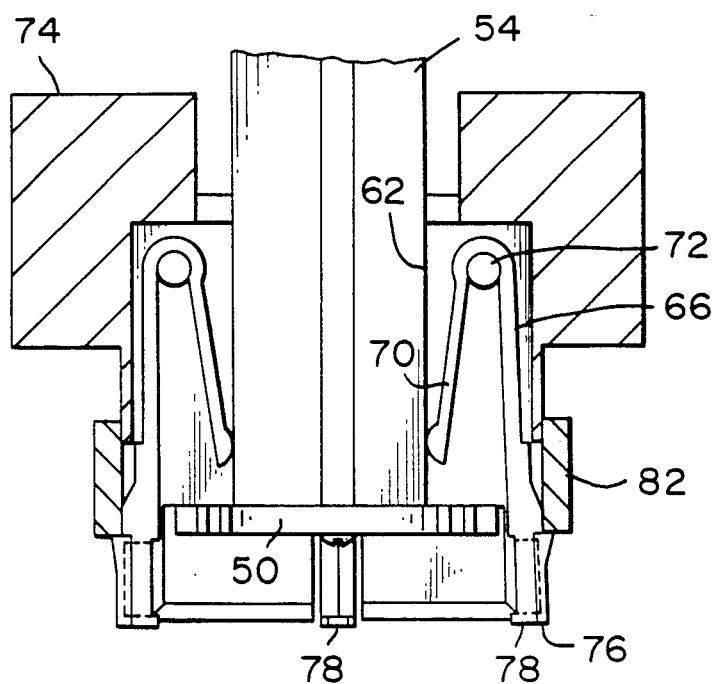
FIG. 7 is a view similar to FIG. 6 but showing the positions of the parts when the pulling arms are engaged with the housing.

The camming ring 82 has a square opening 84 therein which is dimensioned such that the ring is slidable on the yoke 65 from an upper position in which it is against the undersides 88 of the projections 74 to a lower or locking position as shown in FIG. 7 in which the camming surface portions 86 at the corners of the opening 84 cam the arms 66 inwardly into engagement with the housing. This camming ring is thus movable in both axial directions on the yoke between a locking position and an unlocked position with respect to the pulling arms.

The reaction plate 50 is a square plate-like member 90 having upper and lower surfaces 92, 94 and side surfaces 96 from which teeth 98 project. The dimensions of the plate member as measured between its side surfaces 96 are such that it can be contained within the square formed by the terminals 4 on the surface 6. The teeth 98 have a length such that they will project over the upper ends of the terminals when the plate is positioned above the housing as shown in FIG. 8. The spacing between the teeth and the thickness of each tooth is such that the teeth will enter the cavities 42 in the housing when the tool is positioned above the housing and moved downwardly. The lower edges 100 of these teeth are preferably roughened by sandblasting or otherwise and are upwardly inclined from their outer ends so that there will be no movement between the free upper end of the terminal arm 24 and its associated tooth when the housing is removed from the terminals.

Figure 5:
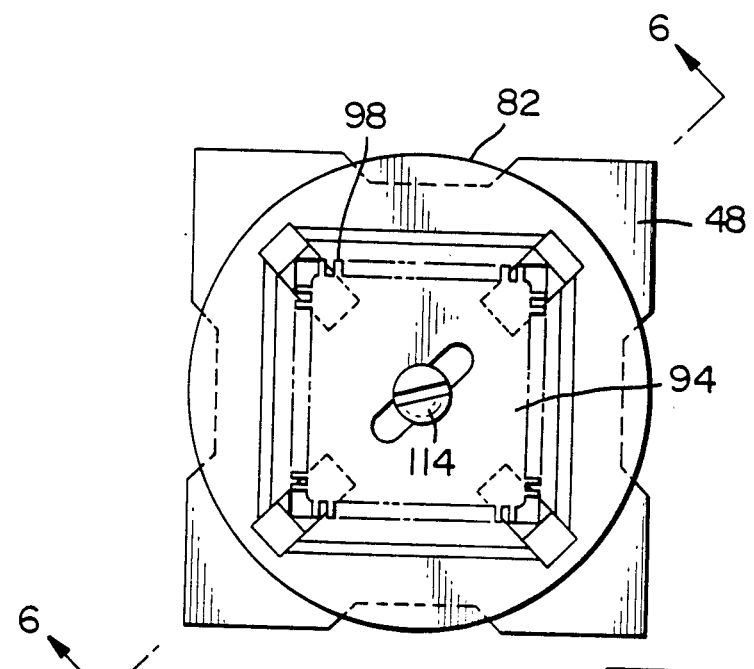
FIG. 5 is a view of the underside of the tool looking in the direction of the arrows 5—5 of FIG. 4.

The reaction plate has a slot 102 centrally located therein and the central portions of this slot have opposed arcuate side surfaces 104 for reception of a screw 114 by means of which the reaction plate is secured to the actuating slide 54. The actuating slide comprises two identical molded parts 108 secured to each other by suitable fastening means as shown and having on its lower end 112 a key 110 which is dimensioned to enter the slot 102. The previously identified screw, which may be a self-tapping screw, extends upwardly through the reaction plate and into the slide as shown in FIG. 5.

The actuating means comprises a handle assembly 52 of a type disclosed in U.S. Pat. No. 4,387,610 which is hereby incorporated by reference in its entirety. The handles 116 have ends 118 which are pivoted to the yoke by pins 119 which extend through adjacent projections 74, the ends of the handles being located between adjacent pairs of projections on opposite sides of the central axis of the tool. At their outer ends, the handles are connected at 120 with integral links 122 which extend towards each other and towards an adapter block 124 which is received in a hollow interior of the slide 54 and which is connected to the slide by fasteners as shown at 126. The movement of the slide is limited by stops 128 and 129 on the slide and on the upper side 58 of the yoke as shown.

In use, and when a housing is to be removed from a group of terminals mounted on a substrate, the camming ring 82 is first moved upwardly to the position shown in FIG. 6 so that the pulling arms extend diagonally or obliquely away from the tool axis. The tool is then positioned above the housing and moved downwardly so that the reaction plate enters the recess in the housing and the teeth enter the contact receiving cavities as shown in FIG. 8. Thereafter, the camming ring 82 is moved downwardly to the position of FIG. 7 so that the pulling arms are arcuately moved inwardly and beneath the corners of the housing. When the camming ring is thus moved downwardly, the pulling arms are locked in their engaged position. It is then merely necessary to close the handles thereby causing the yoke to move relatively upwardly while the reaction plate remains stationary and the housing will be pulled upwardly from the terminals.

An outstanding feature of the disclosed embodiment is that during the pulling operation, the contact terminals 4 are stressed in compression since the teeth 98 on the reaction plate in effect push downwardly on the terminals while the pulling arms 66 pull the housing upwardly. This is an important advantage where the terminals are surface mounted as shown in FIG. 8 for the reason that there is a grave danger, if the terminals are stressed in tension, that the solder bonds between the lower edges of the terminals and the substrate will be broken. However, where the terminals are stressed in compression as happens when the instant tool is operated, there is little or no possibility of damaging the solder bonds.

In this description, it is stated that the terminals are "stressed in compression" in view of the fact that the teeth 98 are pressed against the arms 24 of the terminals when the housing is removed as shown in FIG. 8. In the embodiment of the invention disclosed herein, most of the stresses established in the arm 24 are taken up in the upper portion of the terminal (the yoke 20 and the arm 22) for reasons which are explained in the above application Ser. No. 814,511. Any stresses which are transmitted to the base portion 14 of the terminal will not damage the solder joints at 16 in FIG. 8. If the housing were pulled upwardly without the presence of the reaction plate, substantial tensional stresses would be imposed on the solder joints at 16 and failures in these joints would probably result.

If the invention is practiced with conventional terminals (not having the two arm configuration of FIG. 8) substantial compressive stresses would be transmitted to the solder joints but such stresses would not be destructive as would tension stresses.

Obviously, in the operation of the tool, the housing is pulled upwardly with pulling forces that are parallel to the axis of the tool and, by virtue of the precision with which the parts are made, parallel to the vertical central axis of the housing. This is desirable for the reason that if eccentric pulling forces are applied to the housing, damage may result to the terminals. Experience with the invention has shown that a housing can be removed from and reassembled to a group of terminals repeatedly without damage to the terminals or to the solder bonds between the terminals and the substrate.

Many of the parts of the tool can be made of plastic if desired. The yoke, particularly, can be of plastic as can the actuator means such as the handles and the slide members. The reaction plate preferably is of metal for the reason that the teeth must bear against the upper ends of the terminals and will be stressed to a substantial extent.

The method of the invention requires, in general, the steps of positioning a compressive force applying member against the terminal end portion of each terminal, positioning pulling force applying members against the housing at least two locations on the housing which are opposed to each other with respect to the vertical center line of the housing, and simultaneously applying pulling forces to the housing by means of the pulling force members and compressive forces to each of the terminals by means of the compressive force members. The housing will thus be removed and during removal, the terminals will be compressively stressed and will not be pulled from the substrate. As noted above, the terminals have an interference fit in the cavities and, in the absence of the compressive forces, would be pulled upwardly along with the housing. There would therefore be a tendency for the terminals to be removed along with the housing, particularly if the terminals are surface mounted as shown. The method of the invention can be carried out with tools other than the one shown and described above.

The invention makes it possible not only to inspect the solder joints of a socket assembly mounted on a substrate, but also to replace one or more terminals if replacement is required. The procedure for making repairs is as follows.

The housing is removed from the substrate leaving the terminals on the surface 6 as explained above. The defective terminal is then identified and removed by desoldering. A replacement terminal is then inserted into the housing in the proper cavity. The housing is then replaced with the remaining terminals acting as guides for the housing. The replacement terminal will be positioned against the appropriate area 10 and soldered thereto by heating. The housing thus acts as a fixture in the repair procedure.

We claim:

1. A pulling tool of the type comprising a yoke having a central axis, a plurality of pulling arms pivoted to the yoke at spaced angular intervals around the central axis, the arms extending from the yoke beside, and along, the central axis in a first axial direction and being arcuately movable towards and away from the central axis, a reaction member and actuating means for moving the yoke relative to the reaction member in a second axial direction which is the opposite direction of the first axial direction, the tool being intended to remove a housing from a group of terminals which are mounted on a substrate, the terminals being arranged in at least two parallel rows and having terminal end portions which are spaced from the substrate, the housing having a lower face which is parallel to, and opposed to, the substrate and having an upper face which is spaced from the substrate, a recess extending inwardly from the upper face towards the lower face, the recess having recess sidewalls which surround the recess and which extend inwardly from the upper face, the housing having terminal receiving cavities which extend inwardly from the recess sidewalls and which extend from the lower face towards the upper face, the terminals being in the cavities, the tool being characterized in that:

the reaction member comprises a reaction plate having parallel major surfaces and circumferential side surfaces which extend normally of the major surfaces, the reaction plate being dimensioned to fit between the rows of terminals, the pulling arms have free ends, the free ends having housing engaging portions for engagement with the housing, whereby, upon placing the tool above the housing with the reaction plate between the rows of terminals, thereafter arcuately moving the pulling arms towards the central axis until the housing engaging portions are engaged with the housing, and thereafter moving the yoke relative to the reaction plate in the second axial direction, the housing will be pulled from the terminals.

2. A pulling tool as set forth in claim 1 characterized in that locking means are provided for releasably locking the arms in engaged positions with the housing.

3. A pulling tool as set forth in claim 2 characterized in that the locking means comprises a locking cam in surrounding relationship to the arms, the locking cam being movable relative to the arms in the first and second axial directions between a locking position and an unlocked position, the locking cam and the arms having camming surfaces and cam follower surfaces thereon for locking the arms in the engaged positions when the locking cam is in its locking position.

4. A pulling tool as set forth in claim 3 characterized in that the terminals are arranged in two parallel rows forming a rectangular pattern, the housing being rectangular, the tool having four pulling arms for engagement with the housing at the corners thereof.

5. A pulling tool of the type comprising a yoke having a central axis, a plurality of pulling arms pivoted to the yoke at spaced angular intervals around the central axis, the arms extending from the yoke beside and along the central axis in a first axial direction and being arcuately movable towards and away from the central axis, a reaction member and actuating means for moving the yoke relative to the reaction member in a second axial direction which is the opposite direction of the first axial direction, the tool being intended to remove a housing from a group of terminals which are mounted on a substrate, the terminals being arranged in at least two parallel rows and having terminal end portions which are spaced from the substrate, the housing having a lower face which is parallel to, and opposed to the substrate and having an upper face which is spaced from the substrate, a recess extending inwardly from the upper face towards the lower face, the recess having recess sidewalls which surround the recess and which extend inwardly from the upper face, the housing having terminal receiving cavities which extend inwardly from the recess sidewalls and which extend from the lower face to the upper face, the terminals being in the cavities, the tool being characterized in that:

the reaction member comprises a reaction plate having parallel major surfaces and circumferential side surfaces which extend normally of the major surfaces, the reaction plate being dimensioned to fit between the rows of terminals, the side surfaces having a plurality of teeth extending therefrom for engagement with the terminal end portions of the terminals, the pulling arms extend past the reaction plate in the first axial direction and have free ends which are located beyond the reaction plate, the free ends having housing engaging portions for engagement with the housing, and locking means are provided for releasably locking the arms in engaged positions in which the arms are in engagement with the housing whereby, upon placing the tool above the housing with the teeth in alignment with the terminal end portions of the terminals, thereafter arcuately moving the pulling arms towards the central axis until the housing engaging portions are engaged with the housing, locking the arms in their engaged positions, and thereafter moving the yoke relative to the reaction plate in the second axial direction, the housing will be pulled from the terminals and the terminals will be compressively stressed during movement of the housing.

6. A pulling tool as set forth in claim 5 characterized in that the yoke has a central opening therein, the actuating means comprises an actuating slide which is slidably movable in, and which extends through, the central opening, the slide having one end which is proximate to the free ends of the arms, the reaction plate being secured to the one end of the slide.

7. A pulling tool as set forth in claim 6 characterized in that the actuating means further comprises handles which are pivotally connected to the yoke and link means extending from the handles to the slide.

8. A pulling tool as set forth in claim 7 characterized in that the actuating means comprises two handles which are on opposite sides of the central axis, each handle having a pivoted end, which is pivoted to the yoke, and an outer handle end which is remote from the yoke, the link means comprising links which extend from the outer handle ends to the slide.

9. A pulling tool as set forth in claim 5 characterized in that the locking means comprises a locking cam in surrounding relationship to the arms, the locking cam being movable relative to the arms in the first and second axial directions between a locking position and an unlocked position, the locking cam and the arms having camming surfaces and cam follower surfaces for locking the arms in the engaged positions when the locking cam is in its locking position.

10. A pulling tool as set forth in either of claims 5 or 9 characterized in that the terminals are arranged in a rectangular pattern, the housing being rectangular, the tool having four pulling arms for engagement with the housing at the corners thereof.

11. A pulling tool as set forth in claim 10 characterized in that the terminals are arranged in a square pattern.

12. A pulling tool as set forth in claim 11 characterized in that the terminal end portions of the terminals are located in the cavities and are spaced from the upper face of the housing, the teeth being dimensioned to be received in the cavities, the teeth having edge surface portions which bear against the terminal end portions of the terminals.

13. A pulling tool of the type comprising a yoke having a central axis, a plurality of pulling arms pivoted to the yoke at spaced angular intervals around the central axis, the arms extending from the yoke beside and along the central axis in a first axial direction and being arcuately movable towards and away from the central axis, a reaction member and actuating means for moving the yoke relative to the reaction member in a second axial direction which is the opposite direction of the first axial direction, the tool being intended to remove a housing from a group of terminals which are mounted on a substrate, the terminals being arranged in at least two parallel rows and having terminal end portions which are spaced from the substrate, the housing having a lower face which is parallel to, and opposed to the substrate and having an upper face which is spaced from the substrate, a recess extending inwardly from the upper face towards the lower face, the recess having recess sidewalls which surround the recess and which extend inwardly from the upper face, the housing having terminal receiving cavities which extend inwardly from the recess sidewalls and which extend from the lower face to the upper face, the terminals being in the cavities with the terminal end portions spaced inwardly in the cavities from the upper face of the housing, the tool being characterized in that:

the reaction member comprises a reaction plate having parallel major surfaces and circumferential side surfaces which extend normally of the major surfaces, the reaction plate being dimensioned to fit between the rows of terminals, the side surfaces having a plurality of teeth extending therefrom, the teeth being dimensioned for reception in the cavities and having edge surface portions for bearing against the terminal end portions, the pulling arms extend past the reaction plate in the first axial direction and have free ends which are located beyond the reaction plate, the free ends having housing engaging portions for engagement with the housing, and locking means are provided for releasably locking the arms in engaged positions in which the arms are in engagement with the housing, the locking means comprising a locking cam in surrounding relationship to the arms, the locking cam being movable relative to the arms in the first and second axial directions between a locking position and an unlocked position, the locking cam and the arms having camming surfaces and cam follower surfaces for locking the arms in the engaged positions when the locking cam is in its locking position, the yoke having a central opening, the central axis extending through the central opening, the actuating means comprising an actuating side which is slidably movable in, and which extends through, the central opening, the slide having one end which is proximate to the free ends of the arms, the reaction plate being secured to the one end of the slide, two handles which are on opposite sides of the central axis, each handle having a pivoted end, which is pivoted to the yoke, and an outer handle end which is remote from the yoke, and links which extend from the outer handle ends to the slide whereby, upon placing the tool above the housing with the reaction plate between the rows of terminals and in alignment with the recess in the housing, and with the teeth extending into the cavities, thereafter arcuately moving the pulling arms towards the central axis until the housing engaging portions are engaged with the housing and locking the arms in their engaged positions by means of the locking cam, and thereafter closing the handles to cause the yoke to move relative to reaction plate in the second axial direction, the housing will be pulled from the terminals and the terminals will be compressively stressed during movement of the housing.

14. A method of removing a housing from a group of terminals which are mounted on one surface of a substrate, the terminals being arranged in at least two parallel rows and having terminal end portions which are spaced from the substrate, the housing having a lower face which is parallel to, and opposed to, the substrate and having an upper face which is spaced from the substrate, a recess extending inwardly from the upper face towards the lower face, the recess having recess sidewalls which surround the recess and which extend inwardly from the upper face, the housing having terminal receiving cavities which extend inwardly from the recess sidewalls and which extend from the lower face to the upper face, the terminals being in the cavities, the method comprising the steps of:

positioning a compressive force applying member against the terminal end portion of each of the terminals, positioning pulling force applying members against the housing at least two locations on the housing which are opposed to each other with respect to the vertical center line of the housing which extends normally of the one surface of the substrate, simultaneously applying pulling forces to the housing by means of the pulling force applying members and compressive forces to each of the terminals by means of the compressive force applying members, with the compressive forces directed normally of, and towards, the substrate and with the pulling forces directed normally of, and away from, the substrate whereby, the housing is removed from the terminals by being pulled upwardly and away from the substrate and the reaction forces are transmitted through the terminals as compressive forces.

15. A method as set forth in claim 14 characterized in that the compressive forces are applied to the terminals at the terminal end portions thereof.

16. A method as set forth in claim 15 characterized in that the pulling forces are applied to the lower face of the housing.

17. A method as set forth in claim 14 characterized in that the compressive forces are applied to the terminals by means of a reaction plate which is dimensioned to fit between the rows of terminals and which has teeth extending from side surfaces which are positioned within the cavities and against the terminal end portions.

18. A method as set forth in claim 14 characterized in that subsequent to removal of the housing, a defective terminal is removed from the substrate by desoldering, a replacement terminals is inserted into the cavity of the housing which corresponds to the position of the terminal removed, the housing is reassembled to the terminals, and the replacement terminal is soldered.

* * * * *